United States Patent
Takeuchi et al.

(10) Patent No.: US 8,653,501 B2
(45) Date of Patent: Feb. 18, 2014

(54) EMITTING DEVICE AND MANUFACTURING METHOD THEREFOR

(75) Inventors: Tetsuya Takeuchi, Yokohama (JP); Tatsuro Uchida, Machida (JP); Mitsuhiro Ikuta, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 20 days.

(21) Appl. No.: 13/273,165

(22) Filed: Oct. 13, 2011

(65) Prior Publication Data

US 2012/0032143 A1 Feb. 9, 2012

Related U.S. Application Data

(63) Continuation of application No. PCT/JP2011/003075, filed on Jun. 1, 2011.

(30) Foreign Application Priority Data

Jun. 14, 2010 (JP) ................................. 2010-135137

(51) Int. Cl.
*H01L 33/04* (2010.01)

(52) U.S. Cl.
USPC .......... 257/13; 257/14; 257/19; 257/E33.008; 257/E33.048; 438/45; 438/46; 438/47

(58) Field of Classification Search
USPC .......... 257/13, E33.008, E33.048, 14, 19, 98, 257/103; 438/47, 46, 45
See application file for complete search history.

(56) References Cited

U.S. PATENT DOCUMENTS 6,023,077 A * 2/2000 Iyechika et al. ............... 257/103
6,403,975 B1 * 6/2002 Brunner et al. ................. 257/15
6,570,187 B1 5/2003 Pautrat et al.
7,988,835 B2 8/2011 Takahashi et al.
2011/0165712 A1 7/2011 Uchida

FOREIGN PATENT DOCUMENTS

| JP | 61-222215 | 10/1986 |
|---|---|---|
| JP | 3-123087 | 5/1991 |
| JP | 9-102596 | 4/1997 |
| JP | 2000-77710 | 3/2000 |

(Continued)

OTHER PUBLICATIONS

O.G. Schmidt, et al., "Photoluminescence and band edge alignment of C-induced Ge islands and related SiGeC structures", Applied Physics Letters, Nov. 9, 1998, vol. 73, No. 19, 2790-2792.

(Continued)

*Primary Examiner* — Thinh T Nguyen
(74) *Attorney, Agent, or Firm* — Fitzpatrick, Cella, Harper and Scinto (57) ABSTRACT

Provided is an emitting device which is capable of improving the luminous efficiency of an emitting layer formed using a group IV semiconductor material and obtaining an emission spectrum having a narrow band, and a manufacturing method therefor. The emitting device comprises: an emitting layer having a potential confinement structure, comprising: a well region comprising a group IV semiconductor material; and a barrier region being adjacent to the well region and comprising a group IV semiconductor material which is different from the group IV semiconductor material in the well region, wherein: a continuous region from the well region over an interface between the well region and the barrier region to a part of the barrier region comprises fine crystals; and a region in the barrier region, which is other than the continuous region comprising the fine crystals, is amorphous or polycrystalline region.

20 Claims, 11 Drawing Sheets

(56) References Cited

FOREIGN PATENT DOCUMENTS

| JP | 3210166 | 7/2001 |
|---|---|---|
| JP | 3256091 | 11/2001 |
| JP | 2002-536850 | 10/2002 |
| JP | 2003-158074 | 5/2003 |
| JP | 2007-149848 | 6/2007 |
| JP | 2007-294778 | 11/2007 |
| JP | 4071360 | 1/2008 |
| JP | 2009-117849 | 5/2009 |

OTHER PUBLICATIONS

Inao, et al., U.S. Appl. No. 13/286,973, filed Nov. 1, 2011.

English translation of International Preliminary Report on Patentability, International Application No. PCT/JP2011/003075, Mailing Date Jan. 24, 2013.

* cited by examiner

EMITTING DEVICE AND MANUFACTURING METHOD THEREFOR

CROSS-REFERENCE TO RELATED APPLICATIONS

This application is a continuation of International Application No. PCT/JP2011/003075, filed Jun. 1, 2011, which claims the benefit of Japanese Patent Application No. 2010-135137, filed Jun. 14, 2010.

BACKGROUND OF THE INVENTION

1. Field of the Invention

The present invention relates to an emitting device and a manufacturing method therefor. More particularly, the present invention relates to an emitting device including an emitting layer formed using a group IV semiconductor material and a manufacturing method therefor.

2. Description of the Related Art

At present, most semiconductor emitting devices are formed using a group III-V compound semiconductor material. This is because a group III-V compound semiconductor has a band structure of the direct transition type and high luminous efficiency may be obtained even at room temperature. On the other hand, with regard to a material having a band structure of the indirect transition type such as Si, the luminous efficiency is extremely low, and thus, reputedly, such a material is not suitable as a material of an emitting device. In recent years, attempts are being made to apply to an emitting device even such a material having a band structure of the indirect transition type such as Si, by confining electrons and holes in a region which is as narrow as several nanometers, thereby increasing the probability of emission recombination for generating light. In order to confine electrons and holes in a region of several nanometers in this way, a confinement structure having a high potential barrier (for example, equal to or larger than 300 meV) is necessary, and hence, heterojunction between materials having band gaps which are greatly different from each other is indispensable. In a group III-V compound semiconductor, while attaining lattice match, that is, based on stacking of good quality monocrystalline layers, heterojunction between materials having band gaps which are greatly different from each other may be formed. Examples include GaAs/AlGaAs. With the heterojunction, a quantum well or a quantum dot may be formed to form a confinement region (for example, a well or a dot) surrounded by a potential barrier, and electrons and holes may be confined therein.

On the one hand, with regard to a material based on Si which is a group IV semiconductor, there is no material which has a greatly different band gap and still may attain lattice match. For example, SiC (band gap: 2.2 to 2.9 eV, lattice constant: 4.3596 Å) the band gap of which is sufficiently larger than that of Si (band gap: 1.1 eV, lattice constant: 5.4309 Å) has lattice mismatch which is as high as about 20%, and hence, it is extremely difficult to form a good quality potential confinement region using heterojunction between monocrystalline layers. Meanwhile, with regard to the group IV semiconductor, in order to relax requirements of the above-mentioned lattice match, attempts are being made to form heterojunction with structurally highly flexible amorphous or polycrystalline structure for application to a solar cell or the like. In this case, the solar cell as a photoreceptor device may function, but, due to influence of recombination by many non-emission recombination centers which exist in amorphous or polycrystalline structure, efficiency sufficient for an emitting device cannot be attained.

Accordingly, as a method of forming a potential confinement region in a Si-based material or the like, a method is proposed in which fine crystals the size of which is several nanometers are formed in amorphous or polycrystalline region. This method is a method in which good quality fine crystals are formed in structurally flexible amorphous or polycrystalline structure, and the formed fine crystalline region has nothing existing therein that can be a non-emission recombination center such as a defect or an impurity. By confining electrons and holes in this narrow fine crystalline region, non-emission recombination is suppressed, and further, overlap of a wave function of electrons and a wave function of holes becomes large, and thus, emission recombination is promoted. These two effects enable enhancement of the luminous efficiency even if the material has a band structure of the indirect transition type. Further, in this case, electrons and holes are confined in the region of several nanometers, and hence, due to the quantum size effect, emission wavelengths thereof become shorter compared with those when there is no confinement. Therefore, if the size of the fine crystals may be controlled, design and control of the emission wavelength are possible.

As such a method, Japanese Patent Application Laid-Open No. 2000-77710 proposes an emitting device using Si fine crystals and a SiC polycrystalline structure and a forming method therefor. The emitting device in Japanese Patent Application Laid-Open No. 2000-77710 is formed so as to include an emitting layer in which Si or Ge fine crystals having a particle size on the order of nanometers are dispersed so as to be dot-like in the SiC polycrystalline structure. With regard to the forming method, the emitting device is formed by alternately depositing a SiC polycrystalline film and Si or Ge fine crystals by low pressure chemical vapor deposition or the like. Alternatively, a method is adopted in which, after a SiC polycrystalline film and a Si or Ge polycrystalline film are alternately formed, annealing is carried out in a vacuum or the like to form Si or Ge fine crystals.

Figure 1A:
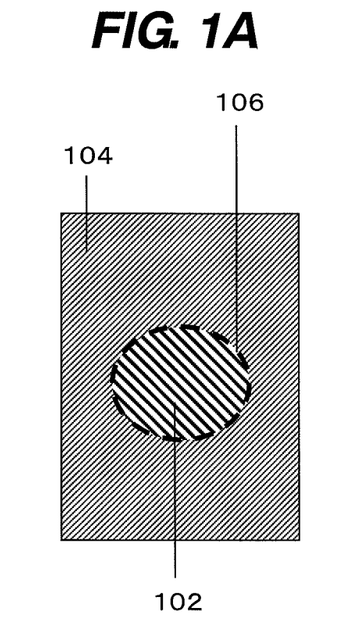
FIG. 1A is a view conceptually illustrating a structure of a conventional example.

The above-mentioned conventional example in Japanese Patent Application Laid-Open No. 2000-77710 has the following problem. The problem is described with reference to FIG. 1 for illustrating comparison between the present invention and the conventional example. In FIGS. 1A to 1D, FIG. 1A illustrates a structure of the conventional example, and FIGS. 1B and 1C conceptually illustrate a structure of the present invention. In the structure of the above-mentioned conventional example, as illustrated in FIG. 1A, Si fine crystals 102 exist in a SiC polycrystalline structure 104, and hence a border 106 between a fine crystalline structure and a polycrystalline structure is coincident with a border 106 between a well and a barrier in a potential confinement structure. This means that, while the crystallinity in a well region is satisfactory, the crystallinity on the border between the well and the barrier and in a barrier region is low. Here, Si is of the indirect transition type, and hence, in order to greatly improve the luminous efficiency, it is necessary to reduce the size of the potential confinement region to several nanometers, more specifically, on the order of 4 nm or smaller. When the well region is caused to be smaller in order to confine electrons and holes in such a small region, the wave functions of the electrons and the holes cannot exist only in the well region but extend greatly to the barrier region.

Figure 2A:
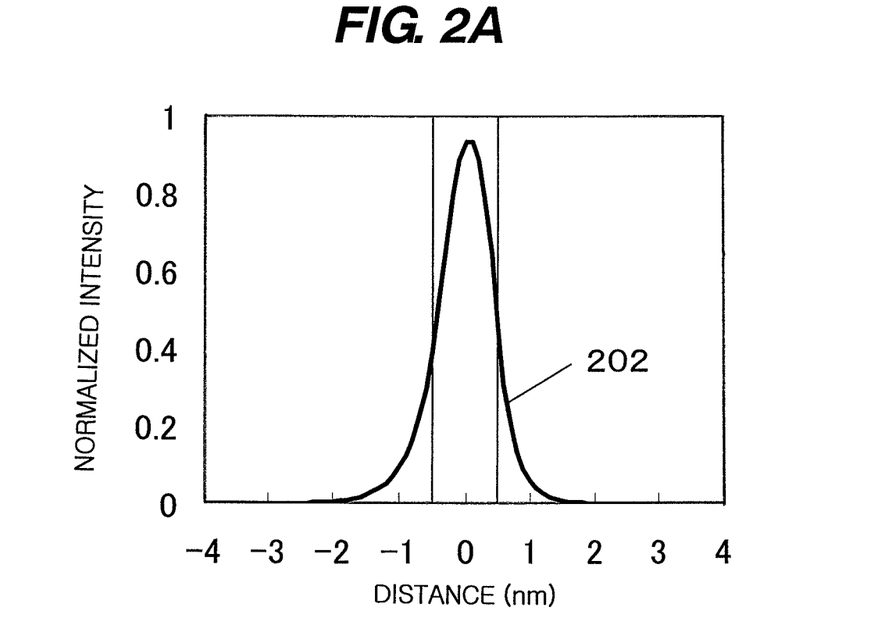
FIG. 2A is an explanatory graph of a wave function in a Si quantum well when $SiO_2$ is used for a barrier layer.
Figure 2B:
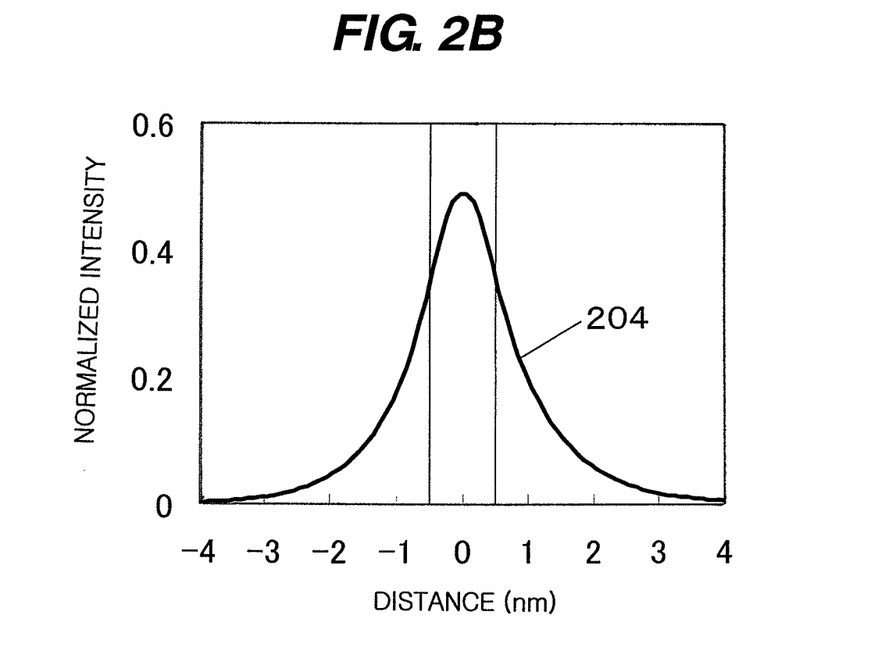
FIG. 2B is an explanatory graph of a wave function in a Si quantum well when SiC is used for the barrier layer.

FIGS. 2A and 2B illustrate exemplary wave functions of electrons in the case of Si quantum well structures. FIG. 2A illustrates a wave function 202 in a case where the thickness of the Si quantum well is 1 nm and $SiO_2$ having a large band gap (8 eV) is used for a barrier layer. Calculation by the present inventors has made it clear that, even in the case of such a large band gap, in an extremely thin region of, for example, 1 nm, the wave function extends to a part of the barrier region (about 1 nm). Similarly, FIG. 2B illustrates a wave function 204 in a case where the thickness of the Si quantum well is also 1 nm and SiC as a semiconductor material through which current may pass is used for the barrier region. In this case, the band gap is smaller than that of $SiO_2$ and the potential barrier becomes lower, and thus, it is also clear that the amount of extension of the wave function to the barrier region becomes further larger (about 3 nm). In this case, the probability of existence of electrons and holes in the barrier layer is no longer negligible, and as a result, the ratio of recombination in the barrier layer becomes larger. Here, the low crystallinity in the barrier layer is reflected to cause non-emission recombination the recombination velocity of which is fast to occur on a priority basis, and, as a result, the luminous efficiency of the emitting layer as a whole is greatly lowered. Further, even if the size on average of the fine crystals may be controlled, it is extremely difficult to make uniform the size of all the fine crystals, and an emission spectrum from the fine crystals has a wide distribution. As a result, the half-width increases.

SUMMARY OF THE INVENTION

In view of the above problem, it is an object of the present invention to provide an emitting device which is capable of improving the luminous efficiency of an emitting layer formed using a group IV semiconductor material and obtaining an emission spectrum having a narrow band, and a manufacturing method therefor.

An emitting device according to the present invention is an emitting device comprising an emitting layer having a potential confinement structure, comprising: a well region comprising a group IV semiconductor material; and a barrier region being adjacent to the well region and comprising a group IV semiconductor material which is different from the group IV semiconductor material in the well region, wherein: a continuous region from the well region over an interface between the well region and the barrier region to a part of the barrier region comprises fine crystals; and a region in the barrier region, which is other than the continuous region comprising the fine crystals, is amorphous or polycrystalline region. Further, a method of manufacturing an emitting device according to the present invention is a method of manufacturing an emitting device, comprising: a first step of, in forming a laminated structure of a well region comprising a group IV semiconductor material and a barrier region being adjacent to the well region and comprising a group IV semiconductor material which is different from the group IV semiconductor material in the well region, forming fine crystals in the well region; and a second step of growing the fine crystals over an interface between the well region and the barrier region into a region which is a part of the barrier region.

According to the present invention, it is possible to realize the emitting device which is capable of improving the luminous efficiency of the emitting layer formed using the group IV semiconductor material and obtaining the emission spectrum having a narrow band, and the manufacturing method therefor.

DESCRIPTION OF THE EMBODIMENTS

Next, an exemplary structure of an emitting device including an emitting layer formed using a material based on Si which is a group IV semiconductor in an embodiment of the present invention is described.

Figure 1B:
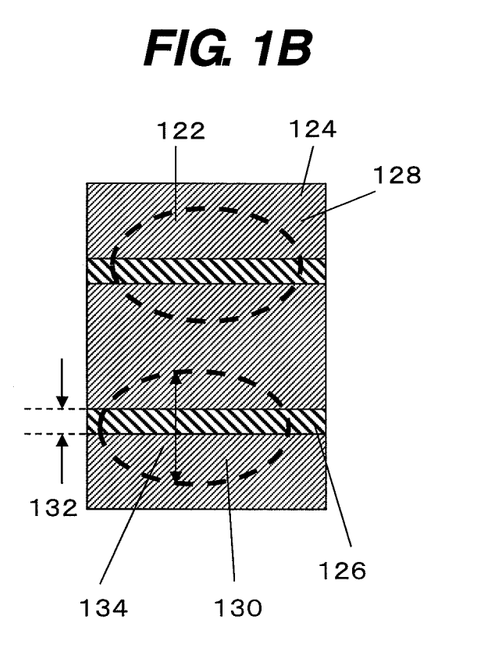
FIG. 1B is a view conceptually illustrating a structure of the present invention.
Figure 1C:
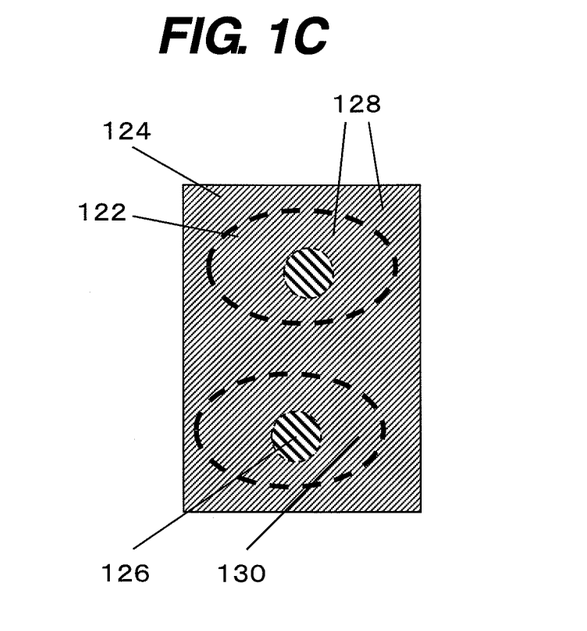
FIG. 1C is a view conceptually illustrating a structure of the present invention.

The present invention is found based on findings that, in order to improve the luminous efficiency in an emitting device including an emitting layer of a confinement structure having a well region of several nanometers, the following structure is effective. More specifically, the present invention is based on findings that, in order to improve the luminous efficiency in such a structure, it is effective that not only a well region but also a region outside the well region in which there is a possibility that electrons and holes exist, that is, a barrier region adjacent to the well region have high crystallinity. This is described with reference to FIGS. 1A to 1D for illustrating comparison between the present invention and the conventional example. FIG. 1B illustrates a quantum well structure and FIG. 1C illustrates a quantum dot structure formed of a group IV semiconductor material. In this example, as the group IV semiconductor material, $Si_xGe_yC_{(1-x-y)}$ may be used. Both of them are formed of a fine crystalline region 122 and amorphous or polycrystalline region 124 from the viewpoint of crystallography, and formed of a Si quantum well region 126 and a SiC barrier region 128 from the viewpoint of potential confinement. Here, the fine crystalline region (in a dotted line) 122 does not only remain in the Si quantum well region 126 but also extends greatly to a part 130 of the barrier region adjacent thereto. It is preferred that a length 132 of the well region in a direction in which potential confinement is carried out be shorter than a length 134 of fine crystals in the same confinement direction. Further, it is desired that the length 134 of fine crystals be three times the length 132 of the well region or more. This enables high luminous efficiency reflecting satisfactory crystallinity even when the wave function extends greatly to the barrier region due to confinement in the extremely small well region. In this structure, it is preferred that a center of the fine crystals is adapted to exist in the well region.

Further, in order to enable current injection, it is desired that the band gap of the material of the barrier region be equal to or smaller than 3 eV. In this case, sufficient conductivity arises in the barrier region and carriers may be injected from the barrier region into the well region. In such a barrier region having a relatively small band gap, the wave function tends to extend more greatly to the barrier region, in which the present invention functions more effectively. More specifically, effective potential confinement and sufficient current injection may be mutually compatible. Further, in the structure of this embodiment, the fine crystal size and the potential confinement size may be separately controlled, and thus, variations in the fine crystal size caused in formation have little effect, and an emission spectrum having a narrow half-width may be obtained. Meanwhile, the extent of requirements of control of the fine crystal size from the viewpoint of controlling the wavelength is relaxed, and hence, requirements on process steps in forming the device are relaxed and a high-yield device may be formed.

As described above, the present invention has a feature of using, for the emitting layer, fine crystals which continuously include the barrier region adjacent to the well region. Further, a method of growing the fine crystals over an interface between the well region and the barrier region into a region which is a part of the barrier region, thereby enabling formation of the structure, is also important. More specifically, in order to form the structure, two steps, i.e., a first step and a second step denoted in (1) and (2) below are important:

(1) as the first step, forming, in the well region, fine crystals or a nucleus to be fine crystals; and (2) as the second step, continuously growing the fine crystals to reach the barrier region.

This may be carried out simultaneously when the laminated structure is formed, or may be carried out after the formation of the laminated structure is once completed. When the structure according to the present invention is built simultaneously when the laminated structure is formed, the laminated structure may be formed so that more or larger fine crystal nuclei or fine crystalline regions are formed in the well region and the barrier region adjacent to the well region. For example, when fine crystals are formed by plasma chemical vapor deposition (plasma CVD), it is known that, by drastically increasing the amount of hydrogen to be introduced, the fine crystal nuclei and the region thereof may increase. It follows that, when the well region and the region which is a part of the barrier region adjacent to the well region and which is 3-nm-wide are formed, the hydrogen flow volume may be increased compared with that when the barrier region other than the part is formed.

In order to ensure formation of desired fine crystals, after the above-mentioned formation, annealing may be carried out with a laser having a wavelength which is absorbed only in the well region. In this method, only the well region is selectively heated more, and hence the fine crystalline region with the well region being the center thereof is more likely to be formed.

Formation of desired fine crystals after the formation of the laminated structure is completed is carried out by two-step annealing. In the first annealing, fine crystals are formed in the well region. Next, by the second annealing, the fine crystals are caused to grow so that the fine crystalline region in the well region extends over the well/barrier interface to reach the barrier region. In the first annealing, in order to selectively form the fine crystals only in the well, a temperature at which fine crystals are formed in the well region but fine crystals are not formed in the barrier region is set. Generally, a material having a large band gap has high atomic binding energy, and thus, in order to crystallize the material (that is, to move atoms thereof to an optimal position), higher energy, i.e., higher temperature is necessary. Therefore, there is a temperature at which fine crystals are formed only in the well. Alternatively, annealing of only the well may be carried out with a laser having a wavelength which is not absorbed in the barrier region but is absorbed only in the well region. In this case, if the laser temporally and continuously irradiates, heat generated by absorption therein extends to the barrier region. Therefore, it is desired that annealing of only the well region be carried out by short-time pulse irradiation with which heat is not diffused into the barrier region.

In the second fine crystalline region growth, the fine crystalline region is caused to grow to reach the barrier region with the fine crystals existing in the well region being nuclei, and thus a temperature higher than the temperature which is necessary to form fine crystals in the well region, that is, higher than the temperature used in the first annealing is necessary. However, the temperature may be lower than a temperature at which fine crystals are formed only in the barrier region. Use of such a temperature enables continuous crystallization from the fine crystals existing in the well region to the barrier region. Alternatively, by carrying out annealing with a laser having a wavelength which is shorter than that of the laser used in the first annealing, fine crystals may be caused to extend to the barrier region with the fine crystals existing in the well region being the nuclei. In order to continuously grow the fine crystals to reach the barrier region in this way, the crystal structures of the well region and of the barrier region are required to be the same or similar to each other. More specifically, it is important that both the well region and the barrier region are of a group IV semiconductor material and are of the diamond type, the sphalerite type, or the wurtzite type. Application of the present invention is possible to a material which is a group IV semiconductor described above containing a small amount of a different element such as boron, phosphorus, oxygen, or nitrogen and which is used for the barrier region, as long as the crystal structure does not change. However, when a material having a completely different crystal structure such as $SiO_2$ or SiN is used for the barrier region, it is difficult to apply the present invention thereto.

According to the configuration of this embodiment described above, an emitting device having sufficient luminous efficiency may be formed even of a group IV semiconductor material of the indirect transition type. Further, emission having a narrow emission spectrum is obtained. Further, with regard to Si, there are various peripheral technologies such as an electronic device and MEMS. By a merger between such technologies and an emitting device according to the present invention on the material level, significant ripple effects such as adding high value to a light source system and reducing costs may be expected.

EXAMPLES

Examples according to the present invention are described in the following.

Example 1

Figure 3A:
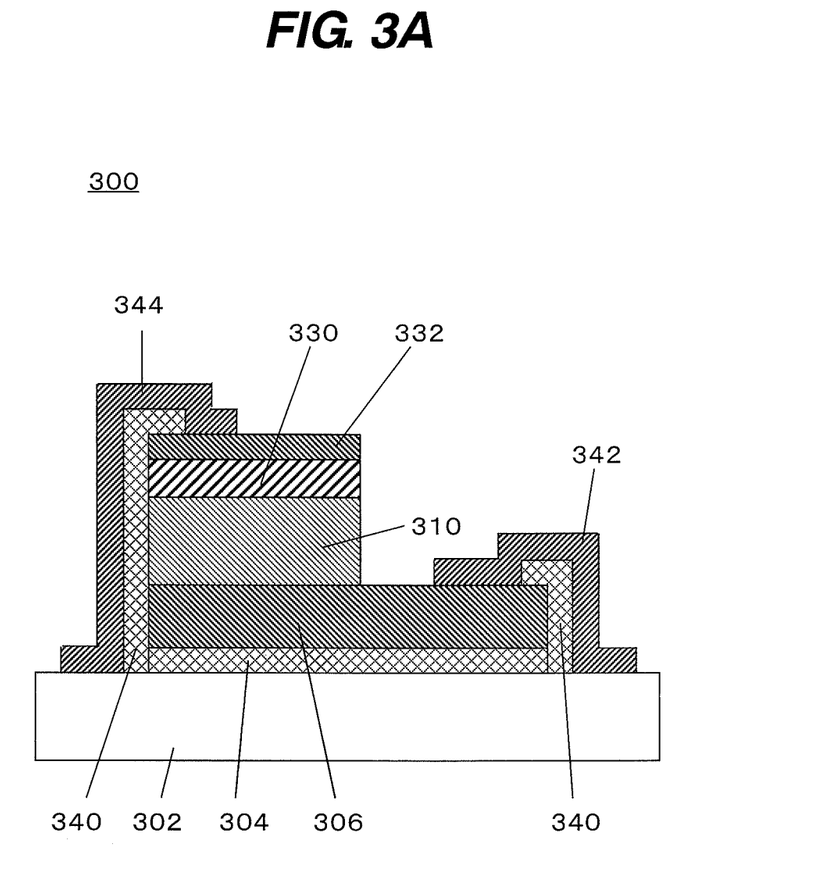
FIG. 3A is a schematic sectional view of an emitting device of Example 1 of the present invention.
Figure 3B:
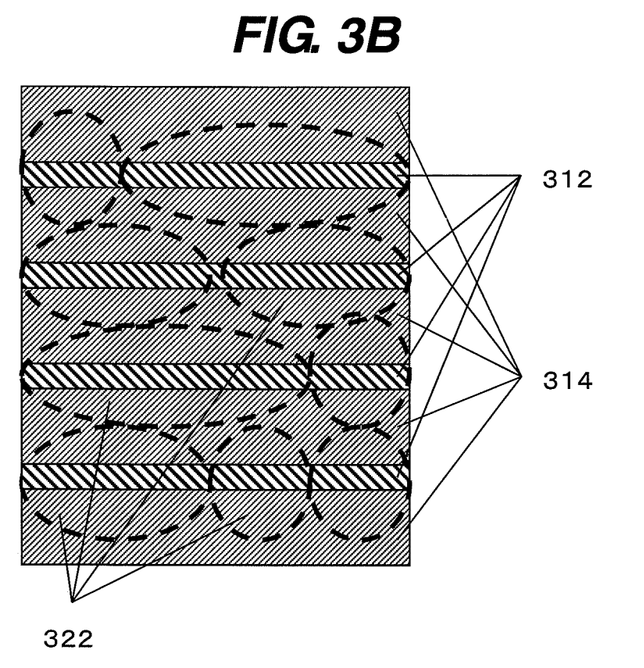
FIG. 3B is a schematic sectional view of an emitting layer of Example 1 of the present invention.

As Example 1, an exemplary structure of an emitting device having fine crystals formed using a material based on Si which is a group IV semiconductor, to which the present invention is applied, is described with reference to FIGS. 3A and 3B. FIG. 3A is a schematic sectional view of an emitting device 300 of this example and FIG. 3B is a schematic sectional view of an emitting layer 310 formed of Si/SiC quantum well fine crystals which forms the emitting device 300. The emitting device 300 of this example has an emission wavelength of 750 to 850 nm. Further, the emitting device 300 of this example is formed of the following layers. An insulating layer 304, an n-type SiC fine crystalline layer 306, the emitting layer 310, a p-type SiC fine crystalline layer 330, and a p-type Si contact layer 332 are stacked on an Si driver substrate 302 having a circuit for driving the emitting device 300 formed thereon, to thereby form the emitting device 300.

The emitting layer 310 includes a multiple quantum well structure formed of a Si quantum well layer 312 of about 1 nm and a SiC barrier layer 314 of about 10 nm. In the emitting layer 310, a potential confinement structure is formed of Si and SiC which are group IV semiconductor materials different from each other. Meanwhile, as illustrated in FIG. 3B, regions closed by dotted lines are fine crystalline regions 322. Here, other regions are amorphous or polycrystalline. The length of the fine crystals is about 10 nm in a stack direction of wells in which confinement is carried out, and the length of the fine crystals in a direction within a plane of a well is equivalent thereto or larger.

The size of fine crystals in the p-type SiC fine crystalline layer 330 and the n-type SiC fine crystalline layer 306 is larger than that of fine crystals in the emitting layer and is as large as several ten nanometers to several micrometers, with which characteristics suitable for a doping layer, and further, for a pn junction may be obtained. Further, for the purpose of current injection, an insulating layer 340, an n-side electrode 342, and a p-side electrode 344 are formed. The electrodes are directly connected by patterning to a circuit in the Si driver substrate so that the emitting device may be driven by the Si driver.

In the structure of this example, sphalerite type SiC is used as the material of the barrier region. The band gap is 2.2 eV, which is smaller than 3 eV, and the center of the fine crystals exists in the well region. Further, the length of the fine crystals in the confinement direction is longer than the length of the well region, and the length of the fine crystals is three times the length of the well region or more. Further, in the structure of this example, the size of the fine crystals is non-uniform. However, the emission wavelength depends on the Si/SiC quantum well structure which carries out potential confinement and does not depend on the size of the fine crystals, and thus the emission wavelength from the respective fine crystals is the same and an emission spectrum having a narrow half-width may be obtained.

Next, a method of manufacturing the emitting device 300 in this example is described.

Figure 4:
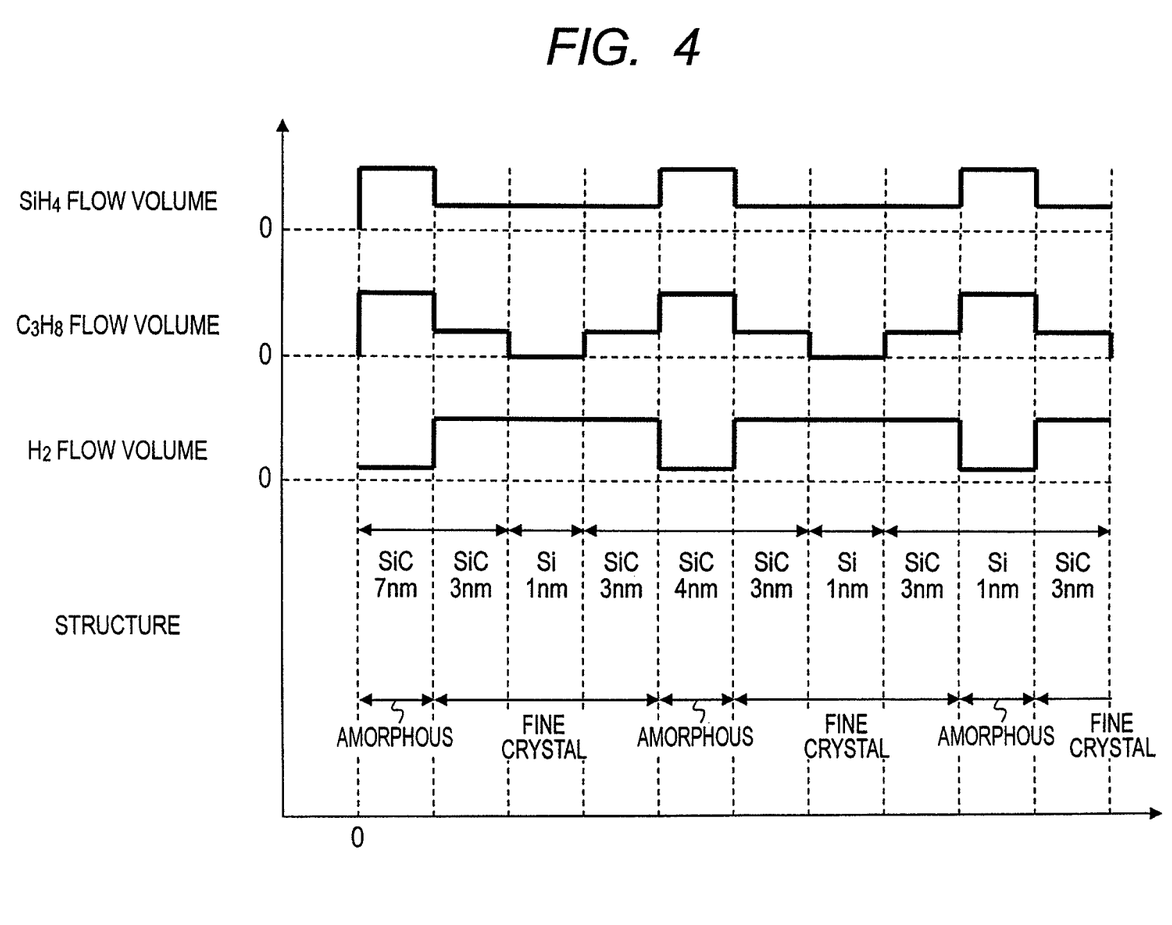
FIG. 4 is an explanatory diagram of a sequence for forming the emitting layer in Example 1 of the present invention.

Here, a method is used in which, in a step of stacking a well region and a barrier region, fine crystals are simultaneously formed in the well region and are grown to reach the barrier region. First, the n-type SiC fine crystalline layer 306 with which desired characteristics may be obtained is formed by plasma CVD on the Si driver substrate 302 covered with the insulating layer 304. As the Si raw material, the C raw material, and the dopant, $SiH_4$, $C_3H_8$, and $PH_3$ diluted to 3% are used, respectively. Further, $H_2$ is introduced so as to obtain fine crystals. The substrate temperature is set to 200 to 400° C. The temperature is also set to a temperature which does not damage the Si driver. Next, the emitting layer is formed. FIG. 4 illustrates correspondence between a lapse of time, and the structure and flow volumes of the respective gases in a sequence for the formation. With regard to the structure, a time region in which the Si quantum well layer and the SiC barrier layer are formed and a time region in which amorphous or fine crystals are formed are illustrated. Further, as the gas flow volumes, changes in $SiH_4$, $C_3H_8$, and $H_2$ flow volumes with respect to the lapse of time are illustrated. First, the SiC barrier layer is formed to have a thickness of 7 nm with the $H_2$ flow volume being low. After that, the $H_2$ flow volume is increased approximately tenfold and the SiC barrier layer is formed to have a thickness of 3 nm. Here, the supply amounts of $SiH_4$ and $C_3H_8$ are reduced to further increase the relative amount of $H_2$ with respect to $SiH_4$ and $C_3H_8$. After this, the supply of $C_3H_8$ is stopped to remain only the supply of $SiH_4$ and $H_2$, and the Si quantum well layer is formed. After the Si quantum well layer is formed to have a thickness of 1 nm with this state being maintained, the supply of $C_3H_8$ is restarted, and with the $H_2$ flow volume being held high, a SiC layer is formed to have a thickness of 3 nm. After that, the $H_2$ flow volume is returned to the original low flow volume, and further, the $SiH_4$ and $C_3H_8$ flow volumes are returned to the original high flow volumes, and the SiC barrier layer is formed to have a thickness of 4 nm. In this way, one set of the Si/SiC quantum well fine crystal structure is formed. By repeating the process multiple times, an emitting layer like the emitting layer 310 illustrated in FIG. 3B which contains multiple quantum well fine crystals may be formed.

Figure 1D:
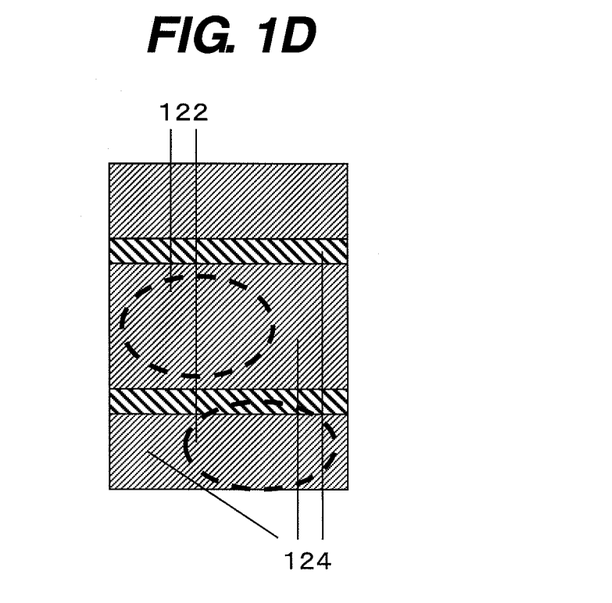
FIG. 1D is an explanatory diagram of comparison between the present invention and the conventional example.

If the Si quantum well layer and the SiC barrier layer are formed with the hydrogen flow volume being high, formation of fine crystals and extension of fine crystals occur randomly. More specifically, as illustrated in FIG. 1D, fine crystalline regions 122 the centers of which do not exist in a well layer are formed at a high rate, and a fine crystalline region in which many amorphous or polycrystalline regions 124 or many interfaces between a fine crystalline region 122 and amorphous or polycrystalline region 124 exist is formed in the well layer. In this way, a situation in which the luminous efficiency is not improved occurs. Only by appropriate change in the $H_2$ flow volume and the like according to the well/barrier structure as illustrated in FIG. 4, a desired structure of an emitting layer like the emitting layer 310 illustrated in FIG. 3B may be obtained. After the emitting layer is formed, the p-type SiC fine crystalline layer 330 and the p-type Si contact layer 332 are formed subsequently. As the dopant, $B_2H_6$ diluted to 3% is used.

Formation of the laminated structure ends at this point. Here, in order to improve the crystallinity of the formed fine crystals, annealing may be carried out. In order to selectively anneal fine crystals many of which exist in a well region, a laser having a wavelength which is absorbed only in the well region may be used in the annealing. Next, a well-known semiconductor process technology is used to expose an n layer, deposit the insulating layer 340, and form the n-side electrode 342 and the p-side electrode 344, to thereby manufacture the device 300 into which current may be injected. Here, as the materials, Si is used for the well region and SiC is used for the barrier region, but it is sufficient that the materials are a combination of group IV semiconductors which may carry out potential confinement, that is, which have band gaps that are different from each other. Further, in the group IV semiconductor materials, as long as the crystal structure thereof (the diamond type, the sphalerite type, or the wurtzite type) does not change, an element which is not a group IV element, for example, boron, phosphorus, oxygen, or nitrogen, may be contained.

Example 2

Figure 5A:
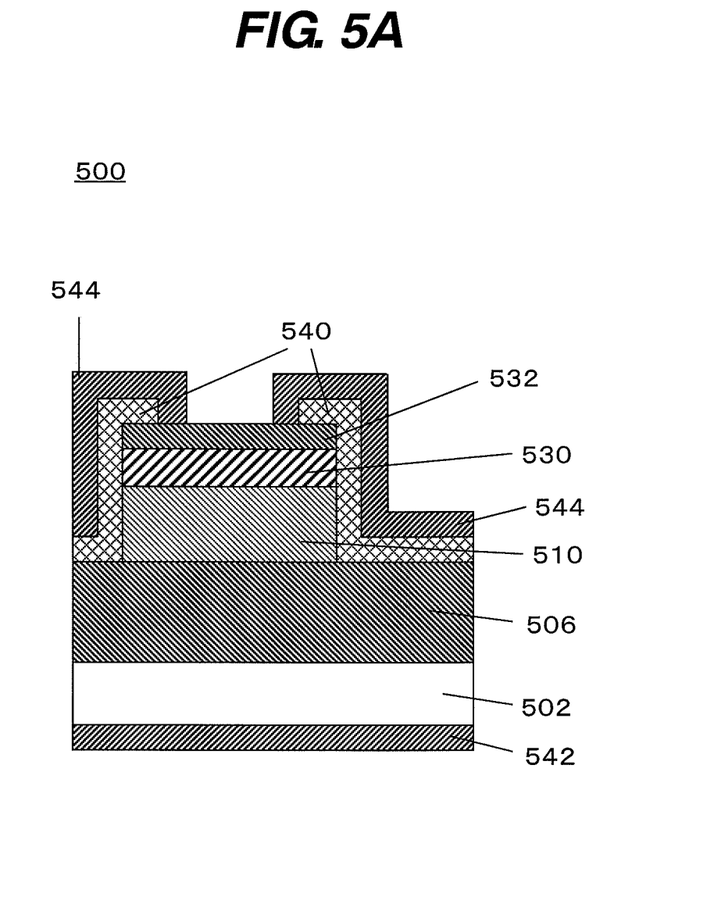
FIG. 5A is a schematic sectional view of an emitting device of Example 2 of the present invention.
Figure 5B:
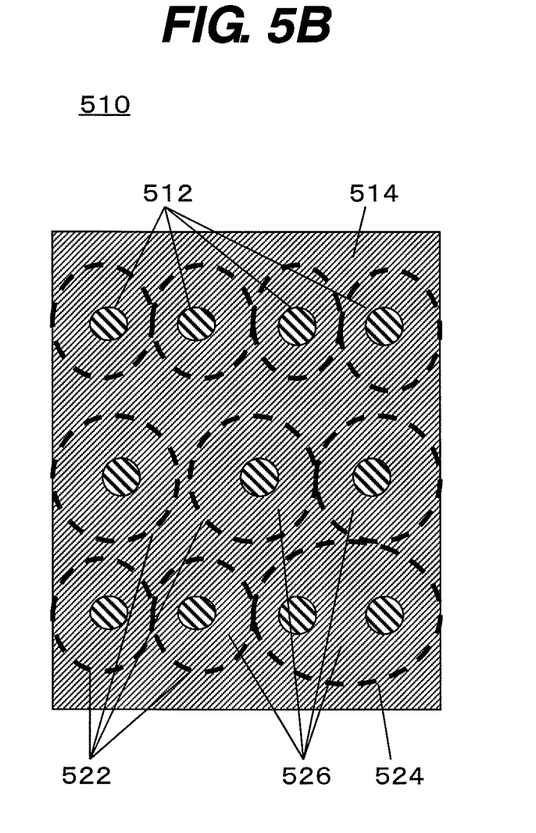
FIG. 5B is a schematic sectional view of an emitting layer of Example 2 of the present invention.

As Example 2, an exemplary structure of an emitting device having fine crystals formed using a material based on Si which is a group IV semiconductor, which has a form different from that of Example 1, is described with reference to FIGS. 5A to 5C. FIG. 5A is a schematic sectional view of an emitting device 500 of this example and FIG. 5B is a schematic sectional view of an emitting layer 510 formed of Si/SiC quantum dot fine crystals which forms the emitting device 500. The emitting device 500 of this example has an emission wavelength of 650 to 700 nm. Further, the emitting device 500 of this example is formed of the following layers. A p-type SiC fine crystalline layer 506, the emitting layer 510, an n-type SiC fine crystalline layer 530, and an n-type Si contact layer 532 are stacked on a p-type Si substrate 502, to thereby form the emitting device 500.

The emitting layer 510 has a multiple quantum dot structure formed of an Si quantum dot 512 of about 2 nm and an SiC barrier region 514 of about 10 nm or more. The Si quantum dot 512 and the SiC barrier region 514 form a potential confinement structure. Meanwhile, as illustrated in FIG. 5B, regions 522 and 524 closed by dotted lines are fine crystalline regions. Here, other regions are amorphous or polycrystalline. The size of the fine crystalline region 522 is about 10 nm. The size of the well region is 2 nm. Further, the region 524 partly exists which extends over two quantum wells and the size of which is about 20 nm.

The size of fine crystals in the p-type SiC fine crystalline layer 506 and the n-type SiC fine crystalline layer 530 is larger than that of fine crystals in the emitting layer and is as large as several ten nanometers to several micrometers, with which characteristics suitable for a doping layer, and further, for a pn junction may be obtained. Further, for the purpose of current injection, an insulating layer 540, a p-side electrode 542, and an n-side electrode 544 are formed. In order to prevent unnecessary current diffusion in the device, the emitting layer 510, the n-type SiC fine crystalline layer 530, and the n-type Si contact layer 532 may be etched so as to be post-like to carry out current confinement. In the n-side electrode 544 on a surface of the device, for the purpose of wiring by wire bonding or the like, an electrode pad of about 100 μm×100 μm is provided in a region which is sufficiently away from the emitting region. In the structure of this example, the material of the barrier region is sphalerite type SiC, the band gap is 2.2 eV, which is smaller than 3 eV, and the length of the fine crystals in the confinement direction is longer than the length of the well region.

Next, a method of manufacturing the emitting device 500 of this example is described. Here, a method is used in which, after a well region and a barrier region are stacked, fine crystals are formed in the well region and are grown to reach the barrier region. First, the p-type SiC fine crystalline layer 506 with which desired characteristics may be obtained is formed by plasma CVD on the p-type Si substrate 502. As the Si raw material, the C raw material, and the dopant, $SiH_4$, $C_3H_8$, and $B_2H_6$ diluted to 3% are used, respectively. Further, hydrogen is introduced so as to obtain fine crystals. The substrate temperature is set to 300 to 700° C. Next, a laminated structure 550 (FIG. 5C) to forming the emitting layer 510 is formed. The laminated structure 550 is formed by alternately depositing a $Si_xC_{1-x}$ amorphous layer 552 of a thickness of about 2 nm and a SiC amorphous layer 554 of a thickness of about 10 nm by plasma CVD. Here, with regard to the $Si_xC_{1-x}$ layer 552, the $SiH_4$ flow volume and the $C_3H_8$ flow volume in formation thereof are adjusted so that x is larger than 0.5 and the Si content thereof is larger than that of the SiC layer 554. More specifically, the ratio of $SiH_4$ supply amount/$C_3H_8$ supply amount is caused to be large.

Figure 5C:
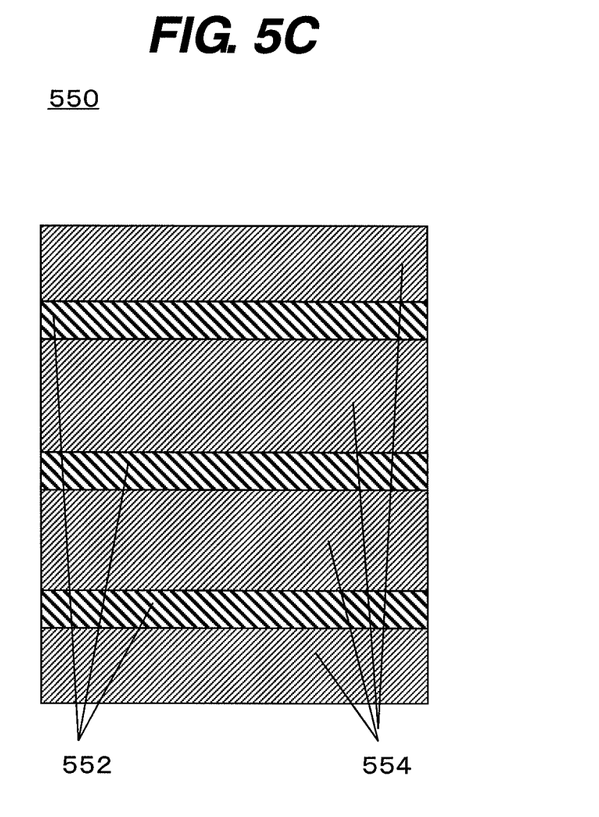
FIG. 5C is a schematic sectional view of a laminated structure of Example 2 of the present invention.

After the laminated structure 550 is formed, the n-type SiC fine crystalline layer 530 and the n-type Si contact layer 532 are formed subsequently. As the dopant, $PH_3$ diluted to 3% is used.

Formation of the laminated structure as a whole ends at this point. Following this, in order to form the emitting layer 510, two-step annealing is carried out. First, the first annealing is carried out for 30 minutes in a hydrogen atmosphere at 500 to 700° C. In the annealing, the Si content of the $Si_xC_{1-x}$ layer 552 is large, and hence the $Si_xC_{1-x}$ layer 552 undergoes phase separation into Si and SiC, and the Si quantum dot 512 is formed in which the particle size is uniform, i.e., about 2 nm. A SiC barrier region is formed around the dot. When the Si content is too large, the structure becomes more similar to that of a Si quantum well. When the Si content is too small, the structure becomes more similar to that of a SiC barrier. Therefore, an appropriate Si content is required. In the annealing, the Si quantum dot 512 formed by phase separation is formed as fine crystals. The SiC region formed by the phase separation and the SiC barrier layer 554 which originally exists remain amorphous or only becomes polycrystalline because the temperature is low.

Then, the second annealing is carried out for 30 minutes in a hydrogen atmosphere at 700 to 1,000° C. By carrying out the annealing at a temperature higher than that of the first annealing, an SiC region 526 around the Si quantum dot 512, that is, fine crystallization of a part of the SiC layer 554 of 10 nm occurs continuously from the Si quantum dot 512 to form the fine crystalline region 522. Here, a temperature lower than a temperature at which SiC singly becomes fine crystals is used, and hence fine crystals are less likely to be formed only in the region of the SiC layer 554 of 10 nm. By this two-step annealing, an emitting layer containing multiple quantum dot fine crystals like the emitting layer 510 illustrated in FIG. 5B may be formed.

Next, a well-known semiconductor process technology is used to form the post-like shape, deposit the insulating film 540, and form the n-side electrode 544 and the p-side electrode 542, to thereby manufacture the device into which current may be injected. Here, as the materials, Si is used for the well region and SiC is used for the barrier region, but it is sufficient that the materials are a combination of group IV semiconductors which may carry out potential confinement, that is, which have band gaps that are different from each other. Further, in the group IV semiconductor materials, as long as the crystal structure thereof (the diamond type, the sphalerite type, or the wurtzite type) does not change, an element which is not a group IV element, for example, boron, phosphorus, oxygen, or nitrogen, may be contained.

Example 3

Figure 6A:
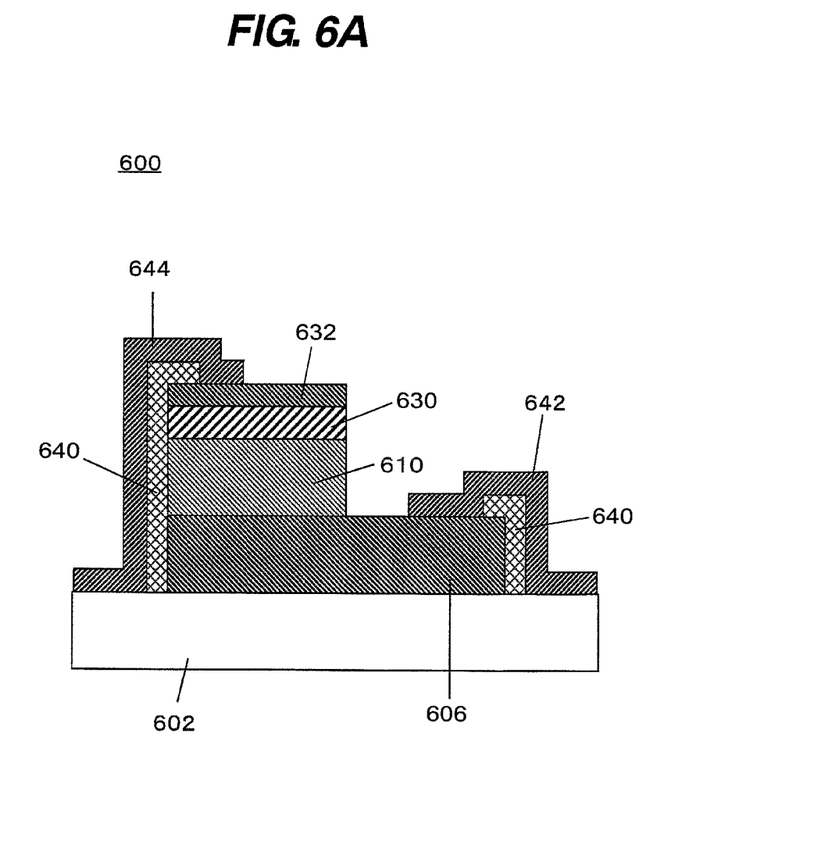
FIG. 6A is a schematic sectional view of an emitting device of Example 3 of the present invention.
Figure 6B:
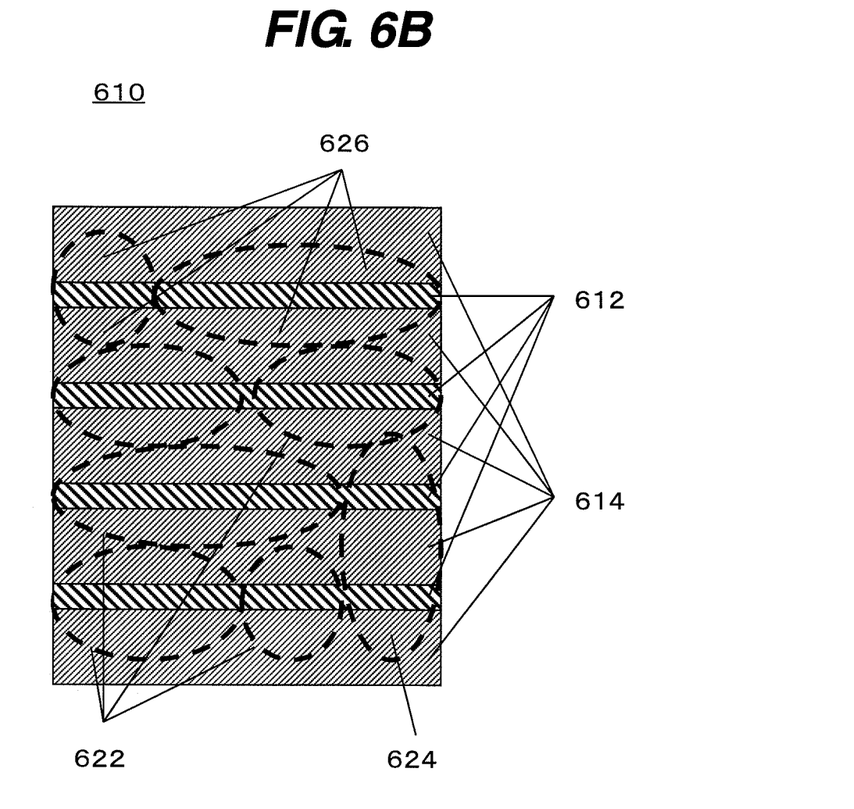
FIG. 6B is a schematic sectional view of an emitting layer of Example 3 of the present invention.

As Example 3, an exemplary structure of an emitting device having fine crystals formed using a material based on Si which is a group IV semiconductor, which has a form different from those of Example 1 and Example 2, is described with reference to FIGS. 6A and 6B. FIG. 6A is a schematic sectional view of an emitting device 600 of this example and FIG. 6B is a schematic sectional view of an emitting layer 610 formed of Si/SiC quantum dot fine crystals which forms the emitting device 600. The emitting device 600 of this example has an emission wavelength of 950 to 1,050 nm. In the following, description of structures which are the same as those in Example 1 and Example 2 is omitted.

FIG. 6A illustrates a structure of an emitting device including an emitting layer 610 on a glass substrate 602. The emitting layer 610 has a multiple quantum well structure formed of a SiGe quantum well layer 612 of about 1 nm and a SiC barrier layer 614 of about 10 nm. The SiGe quantum well layer and the SiC barrier layer form a potential confinement structure. The other points are similar to those in Example 1.

Meanwhile, as illustrated in FIG. 6B, regions 622 and 624 closed by dotted lines are fine crystalline regions. Here, other regions are amorphous. The length of the fine crystals is about 10 nm in a stack direction of wells in which confinement is carried out, and the length of the fine crystals in a direction within a plane of a well is larger than 10 nm. Further, the region 624 partly exists which extends over two quantum wells and the size of which is about 20 nm. An n-type SiC fine crystalline layer 606, the emitting layer 610, a p-type SiC fine crystalline layer 630, and a p-type Si contact layer 632 are stacked on the glass substrate 602.

The size of fine crystals in the p-layer and the n-layer is larger than that of fine crystals in the emitting layer and is as large as several ten nanometers to several micrometers, with which characteristics suitable for a doping layer, and further, for a pn junction may be obtained. Further, for the purpose of current injection, an insulating layer 640, a p-side electrode 644, and an n-side electrode 642 are formed. In order to prevent unnecessary current diffusion in the device, the emitting layer 610, the p-type SiC fine crystalline layer 630, and the p-type Si contact layer 632 may be etched so as to be post-like to carry out current confinement. In the p-side electrode 644 and the n-side electrode 642 on a surface of the device, for the purpose of wiring by wire bonding or the like, an electrode pad of about 100 μm×100 μm is provided in a region which is sufficiently away from the emitting region.

In the structure of this example, the material of the barrier region is sphalerite type SiC. The band gap is 2.2 eV, which is smaller than 3 eV. The wavelength at which absorption starts is equal to or longer than 560 nm. The transition energy of the SiGe quantum well is about 1.2 eV, and the emission wavelength of the SiGe quantum well is about 1 μm. Further, the length of the fine crystals in the confinement direction is longer than the length of the well region, and the length of the fine crystals is three times the length of the well region or more. In the structure of this example, the size of the fine crystals is non-uniform. The emission wavelength depends on the SiGe/SiC quantum well structure and does not depend on the size of the fine crystals, and thus the emission wavelength from the respective fine crystals is the same and an emission spectrum having a narrow half-width may be obtained.

Next, a method of manufacturing the emitting device of this example is described. Here, a method is used in which, after a well region and a barrier region are stacked, fine crystals are formed in the well region and are grown to reach the barrier region. First, the n-type SiC fine crystalline layer with which desired characteristics may be obtained is formed by plasma CVD on the glass substrate 602. As the Si raw material, the C raw material, and the dopant, $SiH_4$, $C_3H_8$, and $PH_3$ diluted to 3% are used, respectively. Further, hydrogen is introduced so as to obtain fine crystals. The substrate temperature is set to 200 to 400° C.

Then, the emitting layer 610 of the SiGe/SiC quantum well structure is formed. A SiGe amorphous layer 612 of about 1 nm and a SiC amorphous layer 614 of about 10 nm are alternately deposited by plasma CVD. The SiGe amorphous layer 612 is formed by supplying $SiH_4$ and $GeH_4$, and the SiC amorphous layer 614 is formed by supplying $SiH_4$ and $C_3H_8$. $H_2$ may also be supplied as necessary. After the emitting layer 610 of the above-mentioned quantum well structure is formed, the p-type SiC fine crystalline layer and the p-type Si contact layer are formed subsequently. As the dopant, $B_2H_6$ diluted to 3% is used.

Formation of the laminated structure as a whole ends at this point. Following this, in order to form the fine crystals in the emitting layer 610 of the above-mentioned quantum well structure, two-step annealing using a laser is carried out. First, the first annealing is carried out by scanning on a wafer with a titanium sapphire laser having a wavelength of 800 nm and a pulse width of several nanoseconds. In the annealing, direct absorption occurs in the SiGe quantum well layer 612, and thus the temperature rises and the fine crystals are formed. On the other hand, with the wavelength used, direct absorption does not occur in the SiC barrier layer 614, and thus temperature rise is suppressed and fine crystals are less likely to be formed in this layer.

Then, the second annealing is carried out by scanning on the wafer with an excimer laser having a wavelength of about 350 nm and a pulse width of several nanoseconds. By carrying out the annealing with a laser having a wavelength shorter than that in the case of the first annealing, fine crystallization of a part 626 of the SiC barrier layer around the SiGe quantum well layer 612 occurs continuously from the SiGe quantum well 612 to form the fine crystalline region 622. Here, an intensity lower than a laser intensity at which SiC singly becomes fine crystals is used, and hence fine crystals are less likely to be formed only in the region of the SiC layer 614 of about 10 nm. By this two-step annealing, an emitting layer containing multiple quantum well fine crystals like the emitting layer 610 illustrated in FIG. 6B may be formed.

Next, a well-known semiconductor process technology is used to form the post-like shape, deposit the insulating film, and form the n-side electrode 642 and the p-side electrode 644, to thereby manufacture the device into which current may be injected. Here, as the materials, SiGe is used for the well region and SiC is used for the barrier region, but it is sufficient that the materials are a combination of group IV semiconductors which may carry out potential confinement, that is, which have band gaps that are different from each other. Further, in the group IV semiconductor materials, as long as the crystal structure thereof (the diamond type, the sphalerite type, or the wurtzite type) does not change, an element which is not a group IV element, for example, boron, phosphorus, oxygen, or nitrogen, may be contained.

Examples 1 to 3 are described above. The structure and manufacturing method according to the present invention are by no means limited to the exemplary structures described in the above-mentioned examples, and combinations which are not described above but which fall within the gist of the present invention are also within the scope of the present invention.

This application is based upon and claims the benefit of priority from Japanese Patent Application No. 2010-135137, filed on Jun. 14, 2010, the content of which is incorporated herein by reference.

What is claimed is:
1. A light emitting device, comprising:
 a light emitting layer having a potential confinement structure, comprising:
 a well region comprising a group IV semiconductor material; and
 a barrier region being adjacent to the well region and comprising a group IV semiconductor material which is different from the group IV semiconductor material in the well region, wherein:
 a continuous region from the well region over an interface between the well region and the barrier region to a part of the barrier region is constituted by fine crystals; and
 a region in the barrier region, which is other than the continuous region, is constituted by amorphous or polycrystalline material.

2. The light emitting device according to claim 1, wherein the group IV semiconductor material comprises $Si_xGe_yC_{(1-x-y)}$.

3. The light emitting device according to claim 1, wherein a center of the fine crystals exists in the well region.

4. The light emitting device according to claim 1, wherein a length of the well region in a confinement direction is shorter than a length of the fine crystals in the confinement direction.

5. The light emitting device according to claim 4, wherein the length of the fine crystals is three times the length of the well region or more.

6. The light emitting device according to claim 1, wherein a band gap of the group IV semiconductor material of the barrier region is equal to or smaller than 3 eV.

7. A light emitting device, comprising:
  a light emitting layer having a potential confinement structure, comprising:
    a well region comprising a group IV semiconductor material; and
    a barrier region being adjacent to the well region and comprising a group IV semiconductor material which is different from the group IV semiconductor material in the well region,
  wherein fine crystals are included in the well region and a part of the barrier region.

8. The light emitting device according to claim 7, wherein the group IV semiconductor material comprises $Si_xGe_yC_{(1-x-y)}$.

9. The light emitting device according to claim 7, wherein a center of the fine crystals exists in the well region.

10. The light emitting device according to claim 7, wherein a length of the well region in a confinement direction is shorter than a length of the fine crystals in the confinement direction.

11. The light emitting device according to claim 10, wherein the length of the fine crystals is three times the length of the well region or more.

12. The light emitting device according to claim 7, wherein a band gap of the group IV semiconductor material of the barrier region is equal to or smaller than 3 eV.

13. The light emitting device according to claim 7, wherein amorphous or polycrystalline material is included in another part of the barrier region.

14. A light emitting device, comprising:
  a light emitting layer having a potential confinement structure, comprising:
    a well region comprising a group IV semiconductor material; and
    a barrier region being adjacent to the well region and comprising a group IV semiconductor material which is different from the group IV semiconductor material in the well region,
  wherein a continuous region from the well region over an interface between the well region and the barrier region to a part of the barrier region includes fine crystals,
  wherein the fine crystals are included in the well region and the part of the barrier region.

15. The light emitting device according to claim 14, wherein the group IV semiconductor material comprises $Si_xGe_yC_{(1-x-y)}$.

16. The light emitting device according to claim 14, wherein a center of the fine crystals exists in the well region.

17. The light emitting device according to claim 14, wherein a length of the well region in a confinement direction is shorter than a length of the fine crystals in the confinement direction.

18. The light emitting device according to claim 17, wherein the length of the fine crystals is three times the length of the well region or more.

19. The light emitting device according to claim 14, wherein a band gap of the group IV semiconductor material of the barrier region is equal to or smaller than 3 eV.

20. The light emitting device according to claim 14, wherein a region in the barrier region, which is other than the continuous region, includes amorphous or polycrystalline material.

* * * * *